United States Patent
Yilmaz et al.

(10) Patent No.: US 8,937,611 B2
(45) Date of Patent: *Jan. 20, 2015

(54) CAPACITIVE TOUCH SENSORS

(71) Applicant: Atmel Corporation, San Jose, CA (US)

(72) Inventors: Esat Yilmaz, Santa Cruz, CA (US); Peter Sleeman, Waterlooville (GB)

(73) Assignee: Atmel Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/094,443

(22) Filed: Dec. 2, 2013

(65) Prior Publication Data

US 2014/0085263 A1    Mar. 27, 2014

Related U.S. Application Data

(63) Continuation of application No. 12/501,296, filed on Jul. 10, 2009, now Pat. No. 8,610,009.

(60) Provisional application No. 61/107,388, filed on Oct. 22, 2008.

(51) Int. Cl.
*G06F 3/044* (2006.01)
*H03K 17/96* (2006.01)
*H03M 11/20* (2006.01)

(52) U.S. Cl.
CPC ............ *G06F 3/044* (2013.01); *H03K 17/9622* (2013.01); *H03M 11/20* (2013.01)
USPC ....................................................... 345/174

(58) Field of Classification Search
None
See application file for complete search history.

(56) References Cited

U.S. PATENT DOCUMENTS

| | | | |
|---|---|---|---|
| 4,290,052 | A | 9/1981 | Eichelberger |
| 4,591,833 | A | 5/1986 | Ishii et al. |
| 4,914,624 | A | 4/1990 | Dunthorn |
| 5,463,388 | A | 10/1995 | Boie |
| 5,526,294 | A | 6/1996 | Ono |
| 5,730,165 | A | 3/1998 | Philipp |
| 5,880,411 | A | 3/1999 | Gillespie |
| 6,323,846 | B1 | 11/2001 | Westerman |
| 6,452,514 | B1 | 9/2002 | Philipp |
| 6,466,036 | B1 | 10/2002 | Philipp |
| 7,006,078 | B2 | 2/2006 | Kim |
| 7,663,607 | B2 | 2/2010 | Hotelling |
| 7,875,814 | B2 | 1/2011 | Chen |

(Continued)

FOREIGN PATENT DOCUMENTS

| WO | WO 00 44018 A1 | 7/2000 |
|---|---|---|
| WO | WO 2010/046650 A2 | 4/2010 |
| WO | WO 2012/129247 | 9/2012 |

OTHER PUBLICATIONS

U.S. Appl. No. 61/454,936, filed Mar. 21, 2011, Myers.

(Continued)

*Primary Examiner* — K. Wong
(74) *Attorney, Agent, or Firm* — Baker Botts LLP (57) ABSTRACT

A touch data set is acquired via signals from each sensing node in a capacitive sensor array having a plurality of sensing nodes. Touch presence and location on the capacitive sensor array is determined from the touch data set. In subsequent sampling periods while presence of a touch continues to be detected, touch data sets may be acquired from respective subsets of the sensing nodes, each subset being located at and adjacent to the touch location determined in the preceding sampling period.

20 Claims, 10 Drawing Sheets

(56) References Cited

U.S. PATENT DOCUMENTS

| | | |
|---|---|---|
| 7,920,129 B2 | 4/2011 | Hotelling |
| 8,031,094 B2 | 10/2011 | Hotelling |
| 8,031,174 B2 | 10/2011 | Hamblin |
| 8,035,622 B2 | 10/2011 | Hotelling |
| 8,040,326 B2 | 10/2011 | Hotelling |
| 8,049,732 B2 | 11/2011 | Hotelling |
| 8,179,381 B2 | 5/2012 | Frey |
| 2006/0007023 A1 | 1/2006 | Wright et al. |
| 2008/0158167 A1 | 7/2008 | Hotelling et al. |
| 2009/0315854 A1 | 12/2009 | Matsuo |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |

OTHER PUBLICATIONS

U.S. Appl. No. 61/454,950, filed Mar. 21, 2011, Lynch.
U.S. Appl. No. 61/454,894, filed Mar. 21, 2011, Rothkopf.
"International Application Serial No. PCT/GB2009/002521, Search Report mailed Apr. 27, 2010" 4 pgs.
International Application Serial No. PCT/GB2009/002521, Written Opinion mailed Apr. 27, 2010, 4 pgs.

FIG. 10

CAPACITIVE TOUCH SENSORS

RELATED APPLICATIONS

This application claims the benefit under 35 U.S.C. 119(e) of U.S. Provisional Patent Application Ser. No. 61/107,388, filed on Oct. 22, 2008, which is incorporated herein by reference in its entirety.

BACKGROUND

The present invention relates to a capacitive touch sensor for detecting proximity and location of a body, more especially to a one or two-dimensional capacitive sensor.

There are various forms of touch sensitive controls which use a capacitive sensor to sense the presence of a body such as a user's finger. A form of touch sensitive control is disclosed in WO-00/44018. In this example a pair of electrodes are provided which act as a key so that the presence of a body such as a user's finger is detected as a result of a change in an amount of charge which is transferred between the two electrodes. With this arrangement, one of the electrodes (labeled X) is driven with a drive circuit and the other of the pair of electrodes (labeled Y) is connected to a charge measurement circuit which detects an amount of charge present on the Y plate when driven by the X plate. As disclosed in WO-00/44018 several pairs of electrodes can be arranged to form a matrix of sensing areas which can provide an efficient implementation of a touch sensitive two-dimensional position sensor. Such two dimensional capacitive transducing (2DCT) sensors are typically used with devices which include touch sensitive screens or touch sensitive keyboards/keypads which are used in, for example, consumer electronic devices and domestic appliances.

Devices employing 2DCT sensors have become increasingly popular and common not only in conjunction with personal computers but also in all manner of other appliances such as personal digital assistants (PDAs), point of sale (POS) terminals, electronic information and ticketing kiosks, kitchen appliances and the like. 2DCT sensors are frequently preferred to mechanical switches for a number of reasons. For example, 2DCT sensors require no moving parts and so are less prone to wear than their mechanical counterparts. 2DCT sensors can also be made in relatively small sizes so that correspondingly small, and tightly packed keypad arrays can be provided. Furthermore, 2DCT sensors can be provided beneath an environmentally sealed outer surface/cover panel. This makes their use in wet environments or where there is a danger of dirt or fluids entering a device being controlled attractive. In addition, manufactures often prefer to employ interfaces based on 2DCT sensors in their products because such interfaces are often considered by consumers to be more aesthetically pleasing than conventional mechanical input mechanisms (e.g. push-buttons).

Other devices which may incorporate 2DCT sensors include pen-input tablets and encoders used in machinery for feedback control purposes, for example 2DCT sensors are capable of reporting at least a 2-dimensional coordinate, Cartesian or otherwise, related to the location of an object or human body part by means of a capacitance sensing mechanism.

As the size of touch sensor arrays increases, it takes longer and longer to acquire a signal value from each of the sensing nodes in the sensor array, which is not desirable. Moreover, it is usually a requirement that the signal acquisition and low level signal processing is carried out with a microcontroller, and it is not desirable to increase the specification of the microcontroller to reduce the data acquisition time.

SUMMARY

A capacitive sensor device may include a capacitive sensor array having a plurality of sensing nodes and a controller operable to acquire touch data from each of the sensing nodes. The capacitive sensor device may be operable to detect the presence and location of a touch from the touch data. The controller may be operable to acquire sets of touch data in a succession of sampling periods such that touch data sets are acquired that include signals from each of the sensing nodes when presence of a touch is absent in a preceding sampling period. The touch data sets may be acquired and may be limited to a subset of the sensing nodes when presence of a touch is detected in a preceding sampling period, each subset being located at and adjacent to the touch location determined in the preceding sampling period.

In a further embodiment, a corresponding method of operating a capacitive sensor array having a plurality of sensing nodes may detect presence and location of a touch in a succession of sampling periods. A touch data set is acquired with signals from each of the sensing nodes. Touch presence and location is determined on the array from the touch data set. In subsequent sampling periods while presence of a touch continues to be detected, touch data sets may be acquired from respective subsets of the sensing nodes, each subset being located at and adjacent to the touch location determined in the preceding sampling period. Once a touch is no longer detected, the process flow may return to acquiring signals from all of the sensing nodes until such time as presence of another touch is determined.

In yet a further embodiment, acquisition of frames of touch data may he sped up by limiting the number of sensing nodes sampled to those situated around a touch registered in the previous sample. Time saving may be based on the assumption that the change in touch state from sample to sample is very often that the same touch has persisted and remains at the same location or an adjacent location. The time gained in data acquisition by making this assumption outweighs the time lost in data acquisition as a result of failing to follow touches that persist but move outside the limited sampling area from one sample to the next as a result of rapid motion. In some embodiments, the time gained may become proportionally greater the larger the sensor array, so if the trend to larger sensor arrays continues various embodiments may become more and more useful. This is because the fraction obtained by dividing the total number of sensing nodes of the device by the number of sensing nodes in the defined subset will tend to get larger as the number of sensing nodes in the device increases.

The capacitive sensor array may be a two-dimensional array of sensing nodes comprising a plurality of first lines and a plurality of second lines, and wherein the subsets of the sensing nodes involve a subset of the first lines. The subsets of the sensing nodes may additionally involve a subset of the second lines. If the subsets are restricted in respect of both the first and second lines, then the sensing nodes sampled are limited to an area in the vicinity of the previously determined touch location. On the other hand, if the subsets are restricted in only in respect of the first lines, then all the sensing nodes along the second lines are sampled, but only a limited number of the sensing nodes along the first lines.

The first and second lines may be the drive and sense lines of an active or transverse type capacitive sensor, referred to as the X and Y lines in the following, or may be lines relating to a passive or single ended type capacitive sensor. Some embodiments may therefore be applied to active or transverse type capacitive touch sensors in which the sensing nodes are formed by coupling capacitances between respective ones of the X and Y lines, the X lines being driven and the Y lines being connected to at least one charge measurement capacitor for measuring the coupling capacitances. Some embodiments may also be applied to passive or single ended type capacitive touch sensors.

Various embodiment may he used in a capacitive, sensor array with one-dimensional arrays of sensing nodes, such as sliders and scroll wheels, as well as to two-dimensional arrays.

In one embodiment, the subset of sampled sensing nodes may be restricted to the sensing node at which the touch has been determined to be present and immediately adjacent sensing nodes in at least one dimension, i.e. nearest neighbors. In other embodiments, in particular if the array has a larger number of sensing nodes, the subset may also be extended to more distant neighbors, for example next nearest neighbors, either in one dimension only or in two dimensions in the case of a two-dimensional sensor array.

BRIEF DESCRIPTION OF THE DRAWINGS

For a better understanding of various embodiments, and to show how the same may be carried into effect, reference is now made by way of example to the accompanying drawings, in which:

FIG. 1b is an example illustration of a user's finger disposed proximate the sensor of FIG. 1a;

DETAILED DESCRIPTION

Figure 1A:
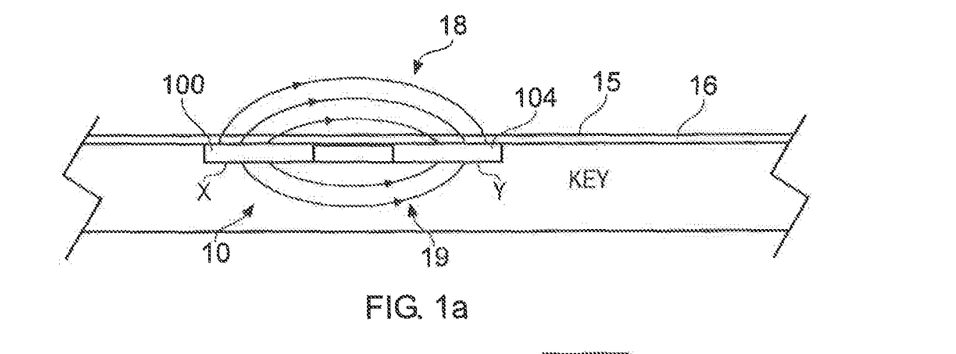
FIG. 1a is a schematic block diagram of a touch sensing node.

FIG. 1a is a schematic cross-section through a touch sensitive control panel 15 in the absence of an actuating body, typically a user's finger or stylus.

Figure 1B:
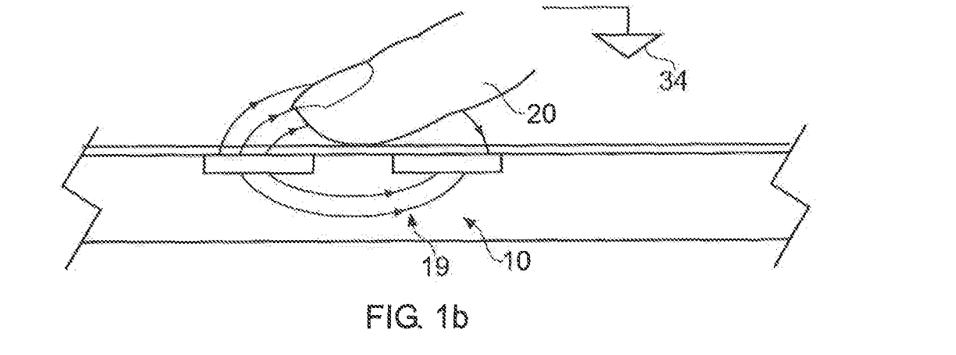

FIG. 1b corresponds to FIG. 1a, but shows the same cross-section in the presence of an actuating body in the form of a user's finger.

The touch sensor shown in FIGS. 1a and 1b correspond to an example embodiment in which a pair of transverse electrodes form a touch sensor. As shown in FIG. 1a a pair of electrodes 100, 104 which form a drive or X plate and a receiving or Y plate in the following description are disposed beneath the surface of a touch sensitive control panel 15. The electrodes 100, 104 are disposed beneath a dielectric layer 16, for example a glass or plastics panel. As shown in FIG. 1a and 1b the touch sensor 10 is arranged to detect the presence of a body such as a user's finger 20 as a result of a change in an amount of charge transferred from the Y plate 104. As shown in FIG. 1a when the X plate 100 is charged or driven by a circuit, an electric field is formed which is illustrated by the lines 18 and 19 both above and below the touch panel surface 15 as a result of which charge is transferred to the Y plate 104. The X plate and the Y plate 100, 104 form a capacitively chargeable sensing node 10, referred to as a key in the following. As shown in FIG. 1b as a result of the disturbance of the electric field 18 due to the presence of the user's finger 20 the electric field above the surface of the control panel 15 is disturbed by the earthing or grounding effect provided by the user's finger 20 as illustrated schematically by ground 34.

Figure 2:
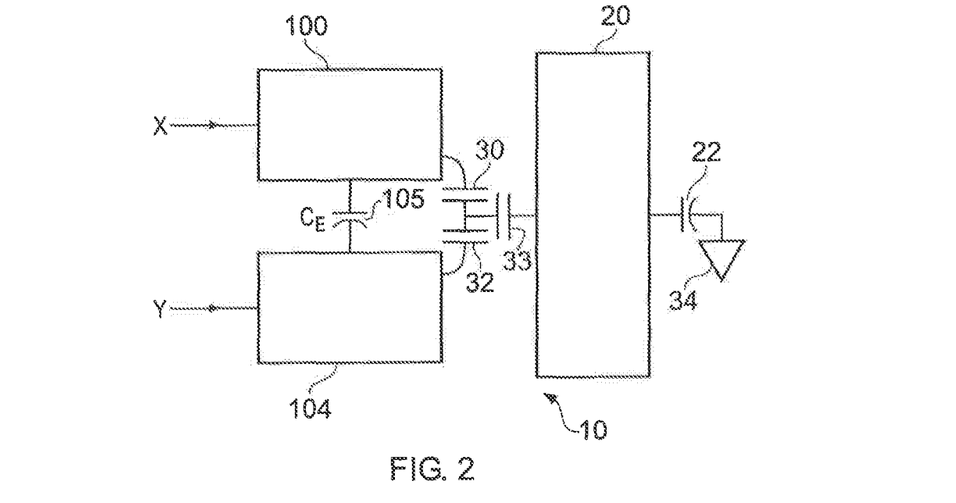
FIG. 2 is a schematic block diagram illustrating an electrical equivalent of the touch sensor shown in FIG. 1b.

An equivalent circuit diagram of the touch sensor shown in FIGS. 1a and 1b is shown in FIG. 2. In FIG. 2 equivalent capacitances are illustrated in the form of a circuit diagram. A capacitance formed between the X plate 100 and the Y plate 104 of the key is a capacitance CE 105 (sometimes also referred to as Cx in the art) which is in effect a coupling capacitor. The presence of the body 20 has an effect of introducing shunting capacitances 30, 32, 33 which are then grounded via the body 20 by an equivalent grounding capacitor 22 to the ground 34. Thus the presence of the body 20 affects the amount of charge transferred from the Y plate of the key and therefore provides a way of detecting the presence of the body 20. This is because the capacitance between the X plate 100 and the Y plate 104 of the key CE 105 reduces as the grounding capacitances 22, 30, 32, 33 increases.

It will be appreciated by the skilled person that FIGS. 1a and 1b are depicting a so-called active capacitive sensors based on measuring the capacitive coupling between two electrodes (rather than between a single sensing electrode and a system ground). The principles underlying active capacitive sensing techniques are described in U.S. Pat. No. 6,452,514. In an active-type sensor, one electrode, the so called drive electrode, is supplied with an oscillating drive signal. The degree of capacitive coupling of the drive signal to the sense electrode is determined by measuring the amount of charge transferred to the sense electrode by the oscillating drive signal. The amount of charge transferred, i.e. the strength of the signal seen at the sense electrode, is a measure of the capacitive coupling between the electrodes. When there is no pointing object near to the electrodes, the measured signal on the sense electrode has a background or quiescent value. However, when a pointing object, e.g. a user's finger, approaches the electrodes (or more particularly approaches near to the region separating the electrodes), the pointing object acts as a virtual ground and sinks some of the drive signal (charge) from the drive electrode. This acts to reduce the strength of the component of the drive signal coupled to the sense electrode. Thus a decrease in measured signal on the sense electrode is taken to indicate the presence of a pointing object.

Figure 3:
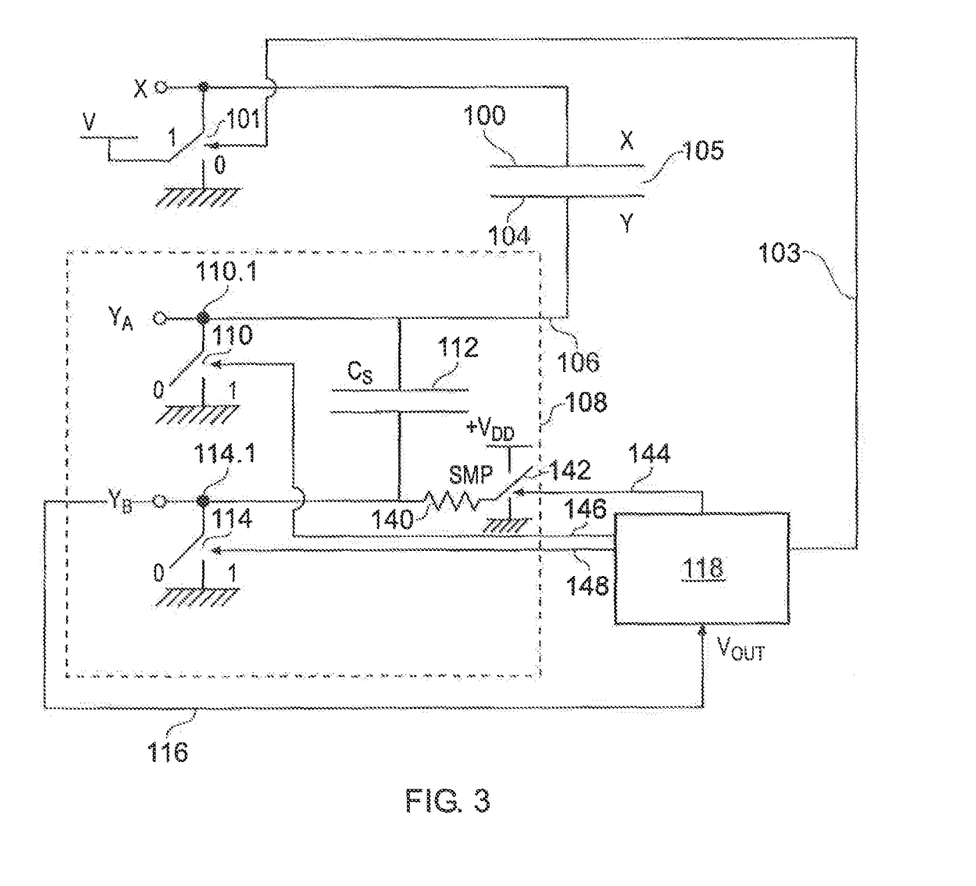
FIG. 3 is a schematic block diagram of a touch sensing circuit for use with the touch sensing node of FIG. 1a and FIG. 1b.

FIG. 3 provides a circuit diagram, which forms a touch sensor by sensing an amount of charge transferred from the X plate 100 shown in FIG. 2 to the Y plate 104 and includes a charge measurement circuit which has been reproduced from WO-00/44018, which corresponds to U.S. Pat. No. 6,452,514.

As shown a drive circuit 101 is connected to the X plate 100 of the key 10 and the Y plate 104 of the key 10 is connected to an input 106 of a charge measurement circuit 108, wherein the X and Y plates collectively form the capacitor 105. The input 106 is connected to a first controllable switch 110 and to one side of a measuring capacitor Cs 112 on which charge is accumulated as a measure of capacitive coupling. The other side of the measurement capacitor 112 is connected via a second controllable switch 114 to an output 116 of the measurement circuit 108 which is fed as a voltage VOUT to a controller 118. A first input control channel 103 is used to control the operation of the drive circuit 101. The first and second controllable switches 110 and 114 are controlled by the controller 118 through respective first and second switch control lines 146 and 148 Similarly, the drive circuit 101 is controlled by the controller 118 through the first input control channel 103.

In the illustrated circuit diagram, a convention has been adopted whereby a control input of each of the switches 110, 114 is open when the control input is "0" and closed when the control input is "1". The other side of each of the switches 110, 114 is connected to ground, so that if the control input is "1" then the connecting input would be connected to ground. A similar convention has been adopted for drive circuit 101, whereby when the control input 103 is "0" the X plate is connected to ground and when the control input is "1" the X plate is connected to a reference voltage "V".

Figure 4:
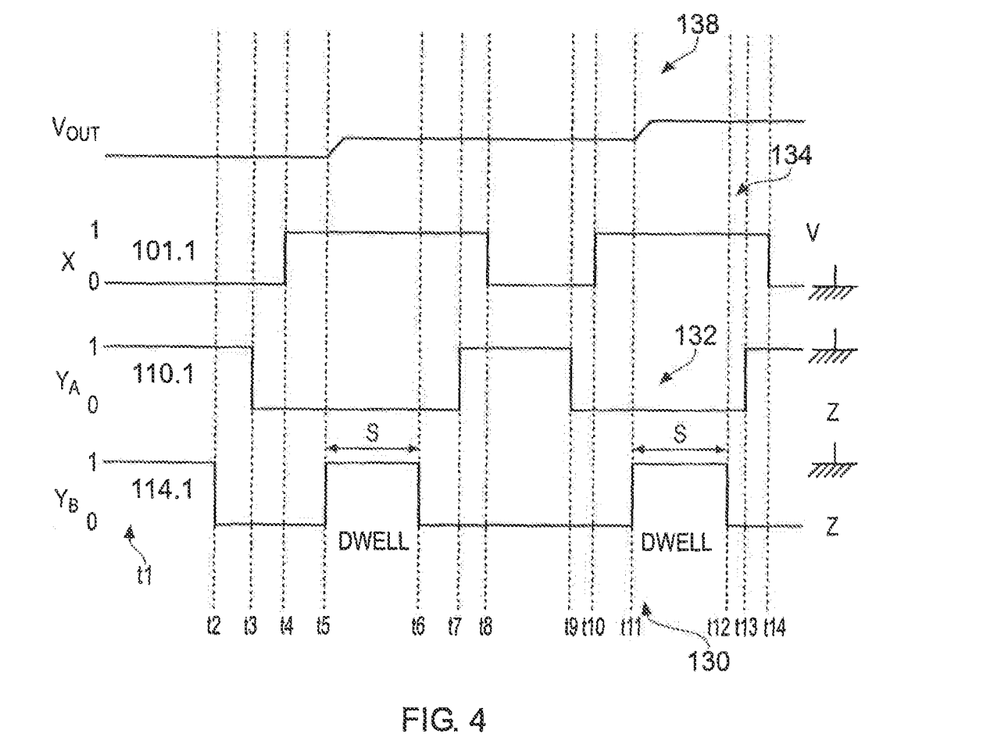
FIG. 4 is an example timing diagram illustrating the operation of the sensing circuit shown in FIG. 3.

FIG. 4 is a timing diagram which shows the operation of the touch sensor, and in particular the function of the measurement circuit arranged to measure the amount of charge transferred from the X plate 100 to the Y plate 104 of the key 10.

Four timing diagrams 130, 132, 134, 138 are shown to illustrate the operation of the measurement circuit 108.

A first timing diagram 130 represents the control input applied to the second switch 114. On the left hand side, the logical value of the control input is shown, whereas on the right hand side the effect at the connecting point 114.1 is shown to be either "Z" in which the connecting point 114.1 is isolated or floating, or for a logical control input of 1 grounded.

A second timing diagram 132 represents the control input applied to the first switch 110. The logical control input values "0" or "1" of a connecting point 110.1 are shown at either floating (Z) or ground (0).

A third timing diagram 134 shows a relative timing of a drive signal provided to the X plate 100 of the key in which case, in contrast to the timing diagrams 130, 132 for the two switches 110, 114, the value of the timing diagram is an absolute value so that the left hand side illustrates that the voltage varies between ground and the reference voltage "V", which is the voltage used to charge the X plate 100.

A fourth timing diagram 138 provides an illustration of the example signal strength or voltage produced on the measurement capacitor 112 as a result of the opening and closing of the switches 110, 114 and the driving of the X plate 100 in accordance with the timing illustrated by the timing diagrams 130, 132, 134. The timing diagrams 130, 132, 134, 138 will now be explained as follows:

At a first time t1 the charge measurement circuit 108 is initialized, i.e. reset, using control lines 146 and 148 for respective switches 110 and 114 being high (1) and control line 103 for drive circuit 101 being low (0). Control lines 146, 148, 103 are lines connected to the controller 118. The Y plate 104, the X plate 100 and the charge measurement capacitor 112 are thus set to ground. Correspondingly, the output voltage across the charge measurement circuit 112 is at zero. It will he appreciated that connections to ground and VDD could be reversed in other embodiments.

At a second time t2 the logical input to the second switch 114 is set low (0), thereby opening the switch and floating the connecting point 114.1.

At a third time t3 the control input to the switch 110 is set low (0), thereby floating the connecting point 110.1, which is YA before, at a time t4 the control input 103 of the drive circuit 101 is set high (1), thereby the X plate 100 of the key 10 is connected to the reference voltage "V". Then, in order to charge the measurement capacitor Cs for a period S between t5 and t6, the control input to the second switch 114 is set high (1), thereby grounding YB to transfer charge induced on the Y plate of the key 104 onto the charge measurement capacitor 112, until time t6, when the control input to the second switch 114 is set low (0), which again floats the connecting point 114.1. After charging the measurement capacitor Cs for a first dwell time between t5 and t6, at t7 the control input to the first switch 110 is set high (1), thereby grounding the connecting point 110.1, which is connected to the other side of the charge measurement capacitor Cs 112. As a result, the voltage across the measurement capacitor can be measured. The amount of charge transferred from the Y plate 104 onto the measurement capacitor Cs 112 during the dwell time between t5 and to is represented as the output voltage VOUT.

At time t8 the control input 103 to the drive circuit 101 goes low (0), thereby the X plate 100 of the key 10 is connected to ground which concludes a first measurement cycle.

At time t9 the next measurement cycle of a measurement burst occurs. At t9 the control input to the switch 110 goes low (0) thereby floating YA, before the control input 103 to the drive circuit 101 again goes high (1), thereby connecting the X plate 100 to the reference voltage "V", at time t10. The measurement capacitor 112 is again charged from charge transferred from the Y plate 104 of the key onto the measurement capacitor 112. As with the first burst at point t11 the control input to the switch 114 goes high (1) thereby grounding the point 114.1 and driving charge onto the measurement capacitor until t12, when the control input to the switch 114 goes low, again floating YB. Thus again charge is transferred from the Y plate 104 during the dwell period between t11 and t12, thereby increasing the voltage across the measurement capacitor Cs as represented as the output voltage VOUT. At 03 the control input to the switch 110 is set high (1) thereby grounding YA and at t14 control input 103 to the drive circuit 101 goes low (0), thereby connecting the X plate 100 of the key 10 to ground which concludes the second measurement cycle. Thus, as with the first measurement cycle, an amount of charge has been transferred from the Y plate, which has then increased the voltage across the measurement capacitor 112, which represents an amount of charge transferred from the Y plate.

After 'n' measurement cycles of a burst, 'n' packets of charge will have been transferred from the Y plate to the measurement capacitor 112 where the charge is accumulated. By bursting in this way the signal from each transfer is averaged on the measurement capacitor 112, so that when it is read out noise reduction has effectively already taken place, as is well known in the art.

The amount of charge on the measurement capacitor 112 is determined with the aid of a resistor 140. One side of the resistor 140 is connected to the measurement capacitor 112 and the other side, labeled SMP, is connected to a controllable discharge switch 142. The discharge switch 142 is connected to receive a control signal from the controller 118 via a control channel 144. The discharge switch 142 grounds SMP when in position '0' and connects SMP to a voltage VDD when in position '1'. The ground position is selected during measurement, i.e. during the cycles illustrated in FIG. 4, and the VDD position is selected to discharge the measurement capacitor Cs 112 through the discharge resistor 140 after charge accumulation through a number of cycles.

The controller 118 is operable to determine the amount of Charge accumulated on the measurement capacitor by measuring the amount of time, e.g. by counting the number of clock periods, it takes for the charge on the measurement capacitor Cs to discharge, i.e. the amount of time for the voltage VOUT to reduce to zero. The number of clock periods can therefore be used to provide a relative signal sample value for the respective measured charge signal.

In alternative embodiments, instead of arranging for the controller 118 to generate a predetermined number of measurement cycles and then measuring the charge present on the Y plate, the controller may operate to continue with the measurement bursts until a predetermined threshold voltage is reached. The number of measurement cycles or bursts of cycles which may be utilized to reach the predetermined threshold then provides an indication of the amount of charge transferred from the X plate to the Y plate and therefore an indication of the capacitive coupling between them. The presence of a body proximate the coupling will change the capacitance between the X and Y plates, and therefore the number of cycles which may be used to reach the threshold, which can therefore be detected by the controller. The advantage of bursting to a threshold in this way is that it can be handled by a simple comparator, one input to which is VOUT and the other is the threshold voltage. This avoids having to sample and measure a value with an analog to digital converter.

Using the same principles of construction and operation, a matrix or grid of touch sensitive switches can be formed to provide a 2DCT sensor. A user can then at a given time select one, or in some cases a plurality of, positions on a sensitive area.

Figure 5:
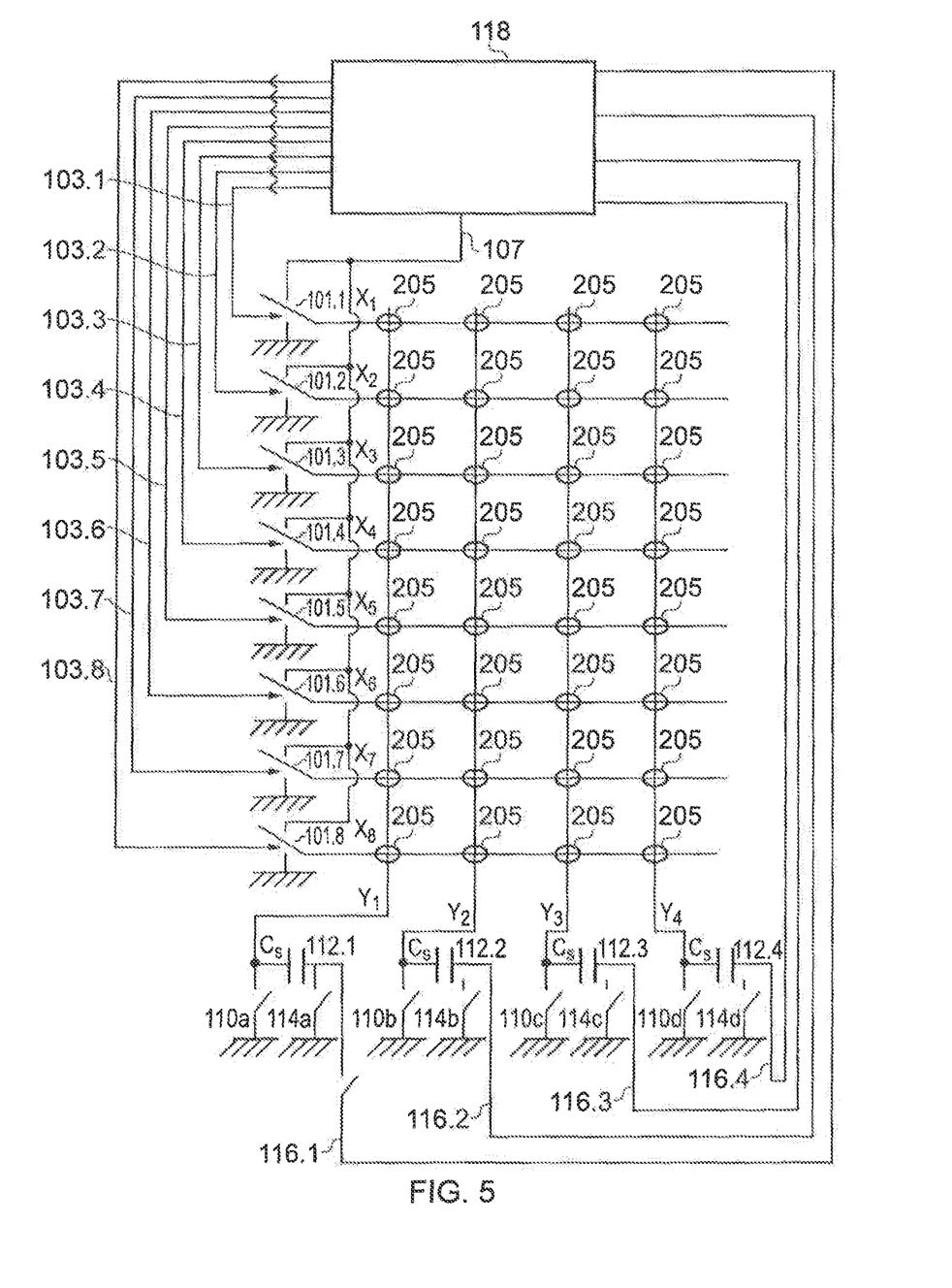
FIG. 5 is a circuit diagram illustrating a touch sensitive matrix providing a two-dimensional capacitive transducing sensor arrangement according to an embodiment.

FIG. 5 shows a two-dimensional touch sensor employing an array of sensors of the kind described with respect to FIGS. 3 and 4. The charge measurement circuit 108 is used in conjunction with drive circuits 101.$m$ where m=1 to 8 and is arranged to drive different sensor points 205. As shown each of the drive circuits 101.$m$ is controlled by the controller 118 to drive each of the corresponding lines Xm, using first control inputs 103.$m$ in the same way as the X plate 100 is driven in FIG. 3 and represented in FIG. 4. Similarly, an input 107 provides a reference voltage "V".

The output of the coupling capacitors at each of the points 205 are connected to one side of measuring capacitors Cs 112.$n$ where n=1 to 4 which are arranged to measure an amount of charge present on the Y plate, Yn providing output signals 116.$n$ to detect the presence of an object in the same way as the operation of the circuit shown in FIG. 3 and FIG. 4. This is achieved by applying control signals to the switches 110$n$ and 114$n$ in a corresponding manner to the arrangement explained above with reference to FIGS. 3 and 4.

In FIG. 5, some of the detail from FIG. 3 has been omitted for clarity. In particular the resistor 140, its switch 142 and actuating line 144 are not shown. It is noted that each of the switches 142 can be commonly actuated by a single actuating line 144 from the controller 118, since they only need to be switched together to perform their function described above.

More details for the operation of such a matrix circuit are disclosed in WO-00/44018.

The controller operates as explained above to detect the presence of an object above one of the matrix of keys 205, from a change in the capacitance of the keys, through a change in an amount of charge induced on the key during a burst of measurement cycles.

Figure 6:
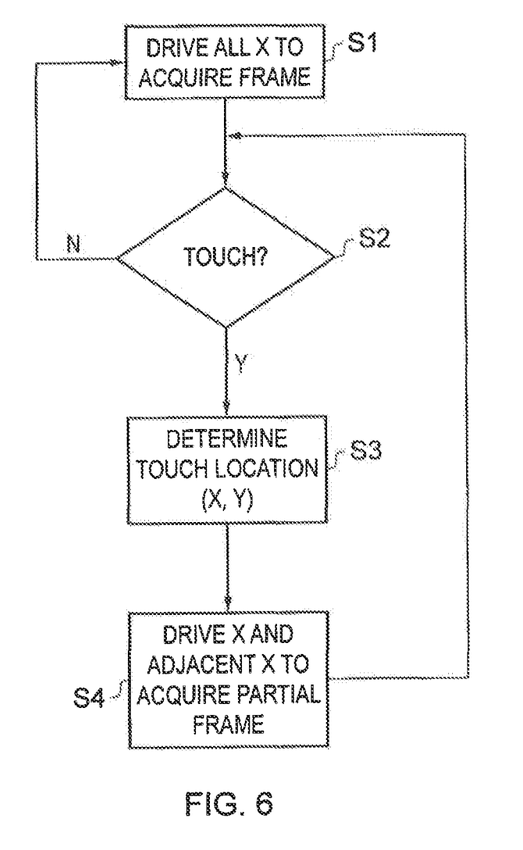
FIG. 6 is a flow diagram showing the process flow for acquiring a frame of touch data from the circuit of FIG. 5.

FIG. 6 is a flow diagram showing the process flow for acquiring a frame of touch data from the circuit of FIG. 5.

In Step S1, the device collects a frame of touch data, i.e. a touch data set comprising a signal value for each of the sensing nodes of the m×n sensor array, where m=8 and y=4 in this embodiment. The frame is collected conventionally by driving each of the X lines in turn. When driving an arbitrary mth X line, charge is accumulated for each Y line on the respective measurement capacitor 112.$n$. At the end of the X drive cycle, the capacitance accumulated is then determined by the controller 118 to obtain Y values for the sensing nodes on that X line. This process is then repeated until all X lines have been driven, at which point a full touch data set or frame has been collected comprising one signal value for each of the m×n sensing nodes on the touch panel.

In Step S2, the controller 118 determines whether a touch has taken place by analyzing the touch data set to establish whether there has been an above-threshold signal on any of the sensing nodes. Reference to touch should not be interpreted literally and should include non-touching proximity of a body. Any sensing node having an above-threshold signal value is said to be "in detect". If no touch is detected then the process flow returns to Step S1 to collect another frame of touch data. If a touch is detected then the process flow proceeds to the next step.

In Step S3, the location of the touch is determined, i.e. the sensing node at which the touch has occurred.

In Step S4, another frame of touch data is collected, but this time not all the X lines are driven, but only those at and adjacent the touch location X detected in the preceding frame. For example, if the touch location detected in the preceding frame is (2, 4), then in Step S4, the controller may only drive the $X_2$ line and the immediately adjacent X lines, namely $X_1$ and $X_3$, thereby to collect a subset of the conventional touch data set. The touch data set then only includes 3×4=12 signal values, rather than the normal 8×4. It will be appreciated that if the touch is at one of the end X lines, i.e. $X_1$ and $X_8$ in this embodiment, then a further reduced number of X lines can be driven, e.g. $X_1$ and $X_2$, or $X_7$ and $X_8$ again assuming only immediately adjacent lines are included in the acquisition.

After Step S4, the process flow returns to Step S2 to determine whether a touch is detected, and the flow proceeds as before. It is noted that if no touch is detected in a reduced touch data set collected in Step S4, this may either be because there is no touch on the touch panel, or because a previous touch has moved from one frame to the next sufficiently quickly to be located on one of the X lines that is not being driven. Whatever the reason, the system will recover by reverting to collection of a full frame whenever no touch is detected in a previous frame.

Figure 7:
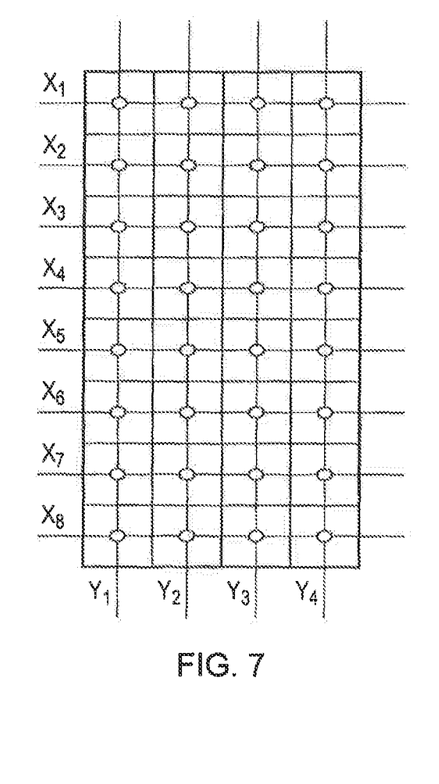
FIG. 7 is a schematic plot of a key pad array overlaid on the sensor grid of FIG. 5.

A concrete example is now described with reference to FIGS. 7 and 8A to 8H. FIG. 7 is a schematic plot of a key pad array overlaid on the sensor grid of FIG. 5. The touch panel can be considered to be subdivided into an array of in m×n square keys each centered on one of the sensing nodes 205. The keys may be real, for example if the touch panel is operating as a keypad, or notional, for example if the touch panel is operating as a surface to sense gestures or drawing activity by a user. FIGS. 8A to 8H each show the key array. In FIGS. 8A to 8H eight successive frames are shown. The location of a detected touch is indicated by shading the touched key.

Figure 8A:
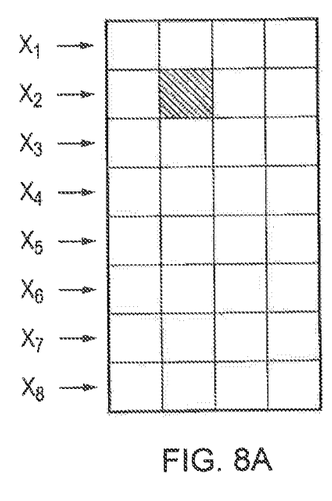
FIGS. 8A to 8H show the key pad of FIG. 7 for eight successive frames.

FIG. 8A shows the start of a touch detection process and corresponds to Steps S1, S2 and S3 of FIG. 6 in that all X lines are driven to collect a full frame and a touch has been detected at key (x, y)=(2, 2).

Figure 8B:
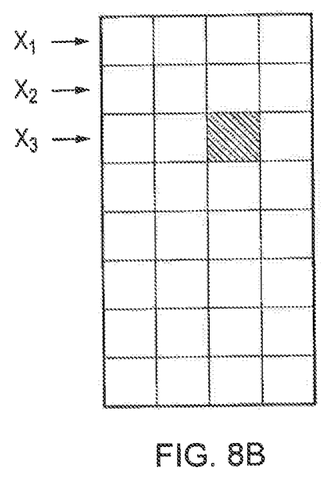

FIG. 8B shows the next time interval corresponding to carrying out Step S4 to drive only $X_1 X_2$, and $X_3$ in view of the key detection at m=2 in the previous frame, followed by detection of another touch at Step S2, which is at position (3, 3) as determined in Step S3.

Figure 8C:
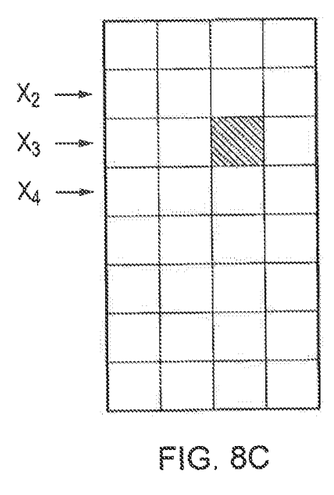

FIG. 8C shows the next time interval corresponding to carrying out Step S4 to drive only $X_2 X_3$, and $X_4$ in view of the key detection at m=3 in the previous frame, followed by detection of another touch in Step S2, which is at position (3, 3) as determined in Step S3.

Figure 8D:
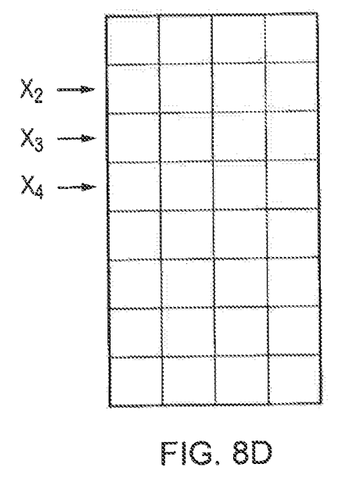

FIG. 8D shows the next time interval corresponding to carrying out Step S4 to drive only $X_2 X_3$, and $X_4$ in view of the key detection at m=3 in the previous frame, followed by non-detection of another touch in Step S2.

Figure 8E:
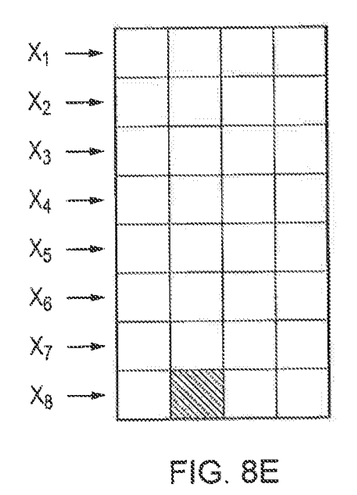

FIG. 8E shows the next time interval corresponding to carrying out Step S1 to drive all $X_m$ in view of the failure to detect a key in the previous (sub-)frame, followed by detection of a touch in Step S2 at location (8, 2). An alternative to driving all $X_m$ in such circumstances would be to drive all $X_m$ apart from those polled in Step S4, i.e. in the present example to drive lines $X_1 X_5 X_6 X_7$ and $X_8$, i.e. all X lines but $X_2 X_3$, and $X_4$.

Figure 8F:
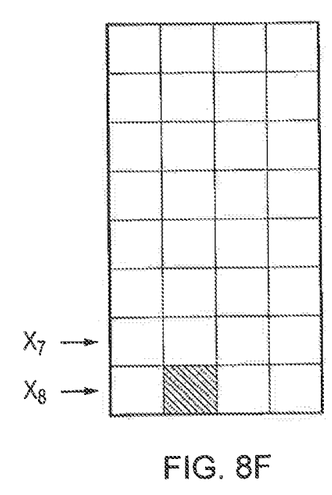

FIG. 8F shows the next time interval corresponding to carrying out Step S4 to drive only $X_7$ and $X_5$ in view of the key detection at m=8 in the previous frame, followed by detection of another touch in Step S2, which is at position (8, 2) as determined in Step S3.

Figure 8G:
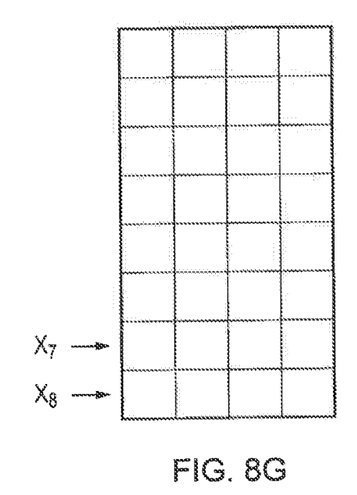

FIG. 8G shows the next time interval corresponding to carrying out Step S4 to drive only $X_7$, and $X_5$ in view of the key detection at m=8 in the previous frame, followed by non-detection of another touch in Step S2.

Figure 8H:
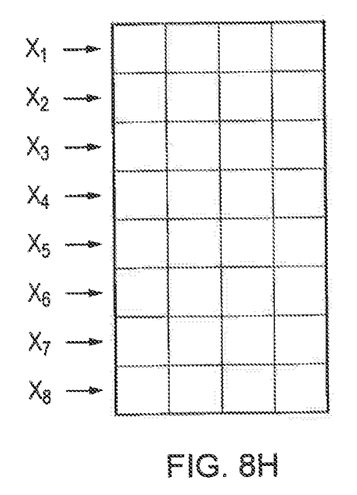

FIG. 8H shows the next time interval corresponding to carrying out Step S1 to drive all $X_m$ in view of the failure to detect a key in the previous (sub-)frame.

For a touch sensor operating to detect user gestures, it might be imagined that the input in FIGS. 8A and 8B is a flick gesture, and the input at FIGS. 8E and 8F is a tap or press.

It will therefore be understood that the device reduces the time needed to acquire each frame by tracking touches in one dimension of the sensor grid, and limiting the X drive to those X lines that are close to the sensed touch.

It is assumed in the above description that all Y lines are sensed all the time. However, the principle of restricting the signal acquisition activity to those sensing nodes close to the touch location measured in the previous frame may be extended to the Y lines also. Namely, the method can be extended so that the controller 118 only seeks Y values for the sensing nodes adjacent to the touch location of the previous frame. Referring to FIG. 6, this would amount to modification of Step S4 so that the controller only collects data from the sense lines at the Y location of the previous touch, and adjacent Y lines. With a device as shown in FIG. 5 in which there is a sensing circuit for every Y line, restricting the acquisition to only some of the Y lines would only save the amount of time used to read out the measurement capacitors of the excluded Y lines. However, in other devices there may only be one sensing circuit which is multiplexed from the Y lines, in which case restricting the acquisition to only sonic of the Y lines would additionally save the amount of time that would have otherwise been used to charge the measurement capacitor for each of the excluded Y lines.

It will be appreciated that the touch sensor forming the basis for the above described embodiment is an example of a so-called active or transverse type capacitive sensor. However, further embodiments may also be applicable to so-called passive capacitive sensor arrays. Passive or single ended capacitive sensing devices rely on measuring the capacitance of a sensing electrode to a system reference potential (earth). The principles underlying this technique are described in U.S. Pat. No. 5,730,165 and U.S. Pat. No. 6,466,036, for example in the context of discrete (single node) measurements.

Figure 9:
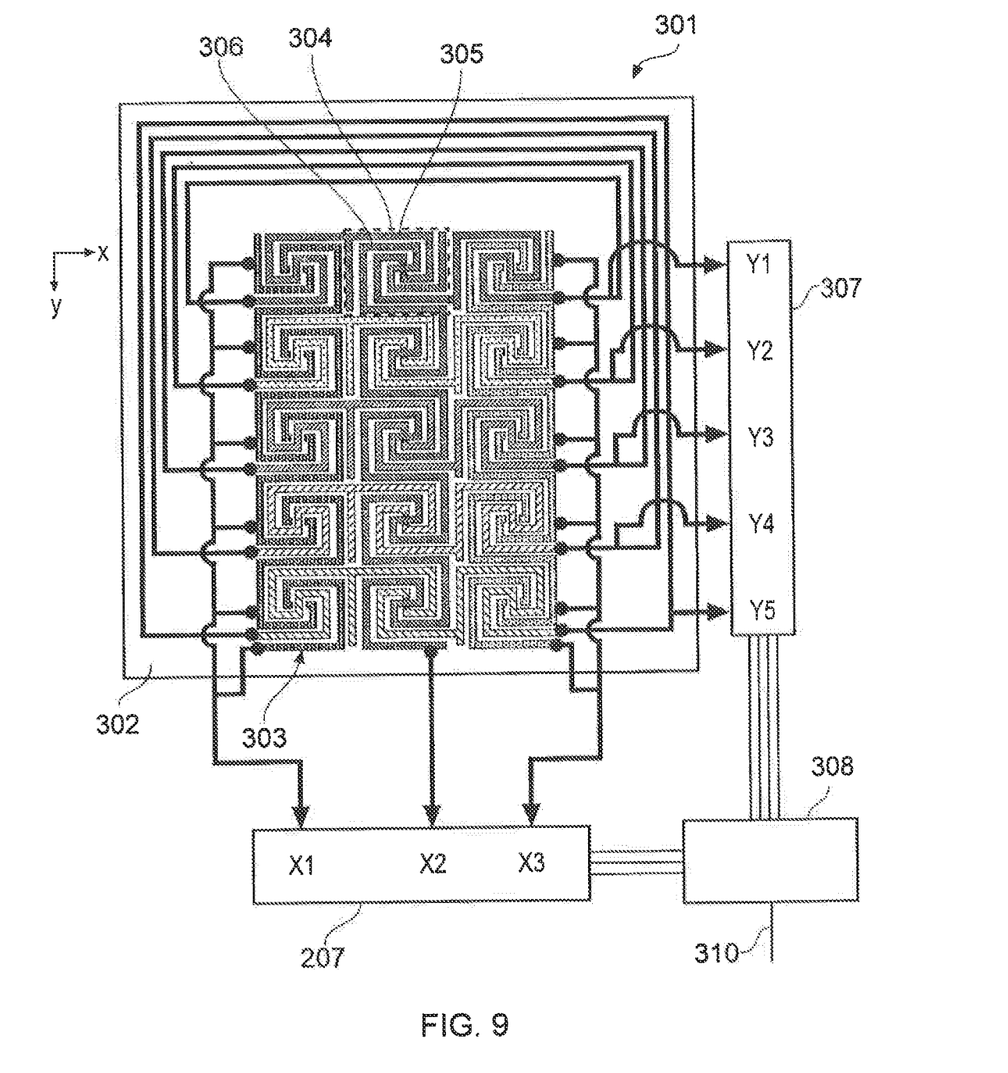
FIG. 9 is a circuit diagram illustrating a touch sensitive matrix providing a two-dimensional capacitive transducing sensor arrangement according to an alternative embodiment.

FIG. 9 is a circuit diagram illustrating a touch sensitive matrix providing a two-dimensional capacitive transducing sensor arrangement according to an alternative embodiment.

A 2D touch-sensitive capacitive position sensor 301 is operable to determine the position of objects along a first and a second direction, the orientation of which are shown towards the top left of the drawing. The sensor 301 comprises a substrate 302 having sensing electrodes 303 arranged thereon. The sensing electrodes 303 define a sensing area within which the position of an object (e.g. a finger or stylus) to the sensor may be determined. The substrate 302 is of a transparent plastic material and the electrodes are formed from a transparent film of Indium Tin Oxide (ITO) deposited on the substrate 302 using conventional techniques. Thus the sensing area of the sensor is transparent and can be placed over a display screen without obscuring what is displayed behind the sensing area. In other examples the position sensor may not be intended to be located over a display and may not be transparent; in these instances the ITO layer may be replaced with a more economical material such as a copper laminate Printed Circuit Board (PCB), for example.

The pattern of the sensing electrodes on the substrate 302 is such as to divide the sensing area into an array (grid) of sensing cells 304 arranged into rows and columns. (It is noted that the terms "row" and "column" are used here to conveniently distinguish between two directions and should not be interpreted to imply either a vertical or a horizontal orientation.) In this position sensor there are three columns of sensing cells aligned with the X-direction and five rows of sensing cells aligned with the Y-direction (fifteen sensing cells in total). The topmost row of sensing cells is referred to as row Y1, the next one down as row Y2, and so on down to row Y5. The columns of sensing cells are similarly referred to from left to right as columns X1 to X3.

Each sensing cell includes a row sensing electrode 305 and a column sensing electrode 306. The row sensing electrodes 305 and column sensing electrodes 306 are arranged within each sensing cell 304 to interleave with one another (in this case by squared spiraling around one another), but are not galvanically connected. Because the row and the column sensing electrodes are interleaved (intertwined), an object adjacent to a given sensing cell can provide a significant capacitive coupling to both sensing electrodes irrespective of where in the sensing cell the object is positioned. The characteristic scale of interleaving may be on the order of, or smaller than, the capacitive footprint of the finger, stylus or other actuating object in order to provide the best results. The size and shape of the sensing cell 304 can be comparable to that of the object to be detected or larger (within practical limits).

The row sensing electrodes 305 of all sensing cells in the same row are electrically connected together to form five separate rows of row sensing electrodes. Similarly, the column sensing electrodes 306 of all sensing cells in the same column are electrically connected together to form three separate columns of column sensing electrodes.

Figure 10:
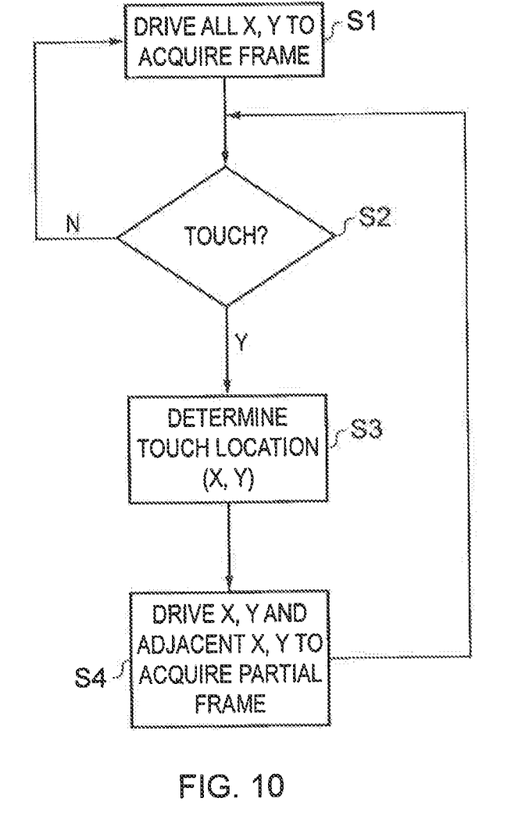
FIG. 10 is a flow diagram showing the process flow for acquiring a frame of touch data from the circuit of FIG. 9.

The position sensor 301 further comprises a series of capacitance measurement channels 307 coupled to respective ones of the rows of row sensing electrodes and the columns of column sensing electrodes. Each measurement channel is operable to generate a signal indicative of a value of capacitance between the associated column or row of sensing electrodes and a system ground. The capacitance measurement channels 307 are shown in FIG. 10 as two separate banks with one bank coupled to the rows of row sensing electrodes (measurement channels labeled Y1 to Y5) and one bank coupled to the columns of column sensing electrodes (measurement channels labeled X1 to X3). However, it will be appreciated that in practice all of the measurement channel circuitry will most likely be provided in a single unit such as a programmable or application specific integrated circuit. Furthermore, although eight separate measurement channels are shown in FIG. 9, the capacitance measurement channels could alternatively be provided by a single capacitance measurement channel with appropriate multiplexing. Moreover, circuitry of the kind described in U.S. Pat. No. 5,463,388 or similar can be used, which drives all the rows and columns with a single oscillator simultaneously in order to propagate a laminar set of sensing fields through the overlying substrate.

The signals indicative of the capacitance values measured by the measurement channels 307 are provided to a controller 308 comprising processing circuitry. The position sensor will be treated as a series of discrete keys or nodes. The position of each discrete key or nodes is the intersection of the x- and y-conducting lines. The processing circuitry is configured to determine which of the discrete keys or nodes has a signal indicative of capacitance associated with it. The processed data can then be output by the controller 309 to other systems components on output line 310.

The controller 309 is operable to output the coordinates on the output connection. The host controller may be a single logic device such as a microcontroller. The microcontroller may have a push-pull type CMOS pin structure, and an input which can be made to act as a voltage comparator. Most common microcontroller I/O ports are capable of this, as they have a relatively fixed input threshold voltage as well as nearly ideal MOSFET switches. The necessary functions may be provided by a single general purpose programmable microprocessor, microcontroller or other integrated chip, for example a field programmable gate array (FPG) or application specific integrated chip (ASIC).

FIG. 10 is a flow diagram showing the process flow for acquiring a frame of touch data from the circuit of FIG. 9.

The process flow is in many respects similar to that shown in FIG. 6, but reflects the differences between the sensor arrays of FIGS. 5 and 9.

In an active or transverse type capacitive sensor, such as shown in FIG. 5, the X lines are driven and the Y lines sensed. On the other hand, in a so-called passive or single-ended capacitive sensor, arrays are essentially built up from isolated buttons.

In Step S1, the device collects a frame of touch data, i.e. a touch data set comprising a signal value for each of the sensing nodes of the m×n sensor array, where m=5 and y=3 in this embodiment. The frame is collected conventionally by measuring capacitance on each of the sensing nodes.

In Step S2, the controller 308 determines whether a touch has taken place by analyzing the touch data set to establish whether there has been an above threshold signal on any of the sensing nodes. If no touch is detected then the process flow returns to Step S1 to collect another frame of touch data. If a touch is detected then the process flow proceeds to the next step.

In Step S3, the location of the touch is determined, i.e. the sensing node at which the touch has occurred.

In Step S4, another frame of touch data is collected, but this time not all the sensing nodes X, Y are sampled, but only those at and adjacent the touch location X, Y detected in the preceding frame. For example, if the touch location detected in the preceding frame is (2, 4), then in Step S4, the controller may only collect signals from sensing nodes (1, 3) (1, 4) (1, 5) (2, 3) (2, 4) (2, 5) (3, 3) (3, 4) and (3, 5), i.e. the sensing nodes immediately adjacent (2, 4), thereby to collect a subset of the conventional touch data set. It will be appreciated that the benefits of the approach in Willis of saving acquisition time become relatively greater, the larger the array size, i.e. the greater the product of m and n.

After Step S4, the process flow returns to Step S2 to determine whether a touch is detected, and the flow proceeds as before. It is noted that if no touch is detected in a reduced touch data set collected in Step S4, this may either be because there is no touch on the touch panel, or because a previous touch has moved from one frame to the next sufficiently quickly to be located on one of the sensor nodes or cells that are not being sampled. Whatever the reason, the system will recover, since it reverts to collecting a full frame if no touch is detected in a previous frame.

It is noted that in the above description, it is assumed that a touch takes place on a single node, and that the location of the touch is at that node position. It will be appreciated by the skilled person that this is an oversimplified view of most current 2D capacitive touch sensors which compute the location of a single touch from all in detect signal values adjacent a maximum signal value. The multiple signal values are combined, for example by interpolation or by making a centroid or centre of mass calculation, to obtain location coordinates at higher resolution than the sensor array grid spacing. Various embodiments may be compatible with such techniques.

For completeness, we summarize one method of interpolation in the following. For each touch, the controller interpolates using the signal values from the key having maximum signal value and any adjacent keys that are in detect. There are various possible interpolation methods that can be used, but we describe only one in the following. Two different equations are used to compute the x- and y-coordinates of the assigned touches. These are Equation 1 and Equation 2, shown below. The terms in both of these equations have the following definition, 'Max' is the signal value of the discrete keys. 'Mid' is the signal value of the discrete key with the highest signal value that is adjacent to 'Max'. 'Min' is the 'zero' signal value which was defined previously. $P_0$ is the offset which corresponds to the nearest x- or y-conducting line. For the x-coordinate $P_0=0$ for X1 and $F_0=1$ for X2. For the y-coordinate $P_0=0$ for Y1, $P_0=1$ for Y2, $P_0=2$ for Y3 and $P_0=3$ for Y4. Q is a number, representing a number of predefined discrete positions within each the discrete keys.

Equation 1 is used when the 'Mid' signal value is to the left of or below the 'Max' signal value. Equation 2 is used when the 'Mid' signal value is to the right of or above the 'Max' signal value.

$$P = P_0 + Q\left(\frac{\text{Max} - \text{Min}}{\text{Max} + \text{Mid} - 2\text{Min}}\right) \quad \text{(Equation 1)}$$

$$P = P_0 + Q - Q\left(\frac{\text{Max} - \text{Min}}{\text{Max} + \text{Mid} - 2\text{Min}}\right) \quad \text{(Equation 2)}$$

The above interpolation method, or other method of calculating the touch coordinates at higher resolution than the internode spacing, may be carried out on the full or partial frames of touch data collected according to various embodiments.

The Abstract is provided to comply with 37 C.F.R. §1.72 (b), and is submitted with the understanding that it will not be used to interpret or limit the scope or meaning of the claims.

What is claimed is:

1. A method comprising:
   acquiring, in a first sampling period, a touch data set with signals from all of a plurality of sensing electrodes in a capacitive sensor array;
   determining presence and location of a touch on the capacitive sensor array from the touch data set; and
   acquiring, in sampling periods after the first sampling period and while continuing to detect presence of the touch, subsequent touch data sets from less than all of the plurality of sensing electrodes.

2. The method of claim 1, wherein the less than all of the plurality of sensing electrodes comprises sensing electrodes located at the location of the touch.

3. The method of claim 1, wherein the less than all of the plurality of sensing electrodes are located in the vicinity of the location of the touch.

4. The method of claim 1, wherein the less than all of the plurality of sensing electrodes comprises:
   a first set of electrodes located at the location of the touch; and
   a second set of electrodes located immediately adjacent to the first set of electrodes.

5. The method of claim 1, wherein the less than all of the plurality of sensing electrodes comprises:
   a first set of electrodes located at the location of the touch;
   a second set of electrodes located immediately adjacent to the first set of electrodes; and
   a third set of electrodes located immediately adjacent to the second set of electrodes.

6. The method of claim 1, wherein the plurality of sensing electrodes are arranged in a two-dimensional array along a first axis and a second axis, wherein the less than all of the plurality of sensing electrodes comprises electrodes arranged along the first axis.

7. The method of claim 6, wherein the less than all of the plurality of sensing electrodes comprises electrodes arranged along the second axis.

8. A capacitive sensor device, comprising:
   a capacitive sensor array comprising a plurality of sensing electrodes;
   a controller operable to:
      acquire touch data from each of the plurality of sensing electrodes in a first sampling period;
      detect presence and location of a touch from the touch data;
      acquire, after the first sampling period and after determining an absence of the touch, a first set of touch data in a second sampling period, the first set of touch data including signals from each of the plurality of sensing electrodes; and
      acquire, in a third sampling period occurring after the first sampling period and while continuing to detect the touch, a second set of touch data from less than all of the plurality of sensing electrodes.

9. The device of claim 8, wherein the less than all of the plurality of sensing electrodes comprises electrodes located at the location of the touch.

10. The device of claim 8, wherein the less than all of the plurality of sensing electrodes are located in the vicinity of the location of the touch.

11. The device of claim 8, wherein the less than all of the plurality of sensing electrodes comprises:
    a first set of electrodes located at the location of the touch; and
    a second set of electrodes located immediately adjacent to the first set of electrodes.

12. The device of claim 8, wherein the less than all of the plurality of sensing electrodes comprises:
    a first set of electrodes located at the location of the touch;
    a second set of electrodes located immediately adjacent to the first set of electrodes; and
    a third set of electrodes located immediately adjacent to the second set of electrodes.

13. The device of claim 8, wherein the plurality of sensing electrodes are arranged in a two-dimensional array along a first axis and a second axis, wherein the less than all of the plurality of sensing electrodes comprises electrodes arranged along the first axis.

14. The device of claim 13, wherein the less than all of the plurality of sensing electrodes comprises electrodes arranged along the second axis.

15. A system comprising:
    a controller configured to:
       acquire touch data from each of the plurality of sensing electrodes in a first sampling period;
       detect presence and location of a touch from the touch data;
       acquire, after the first sampling period and after determining an absence of the touch, a first set of touch data in a second sampling period, the first set of touch data including signals from each of the plurality of sensing electrodes; and
       acquire, in a third sampling period occurring after the first sampling period and while continuing to detect the touch, a second set of touch data from less than all of the plurality of sensing electrodes.

16. The system of claim 15, wherein the less than all of the plurality of sensing electrodes comprises electrodes located at the location of the touch.

17. The system of claim 15, wherein the less than all of the plurality of sensing electrodes are located in the vicinity of the location of the touch.

18. The system of claim 15, wherein the less than all of the plurality of sensing electrodes comprises:
    a first set of electrodes located at the location of the touch; and
    a second set of electrodes located immediately adjacent to the first set of electrodes.

19. The system of claim 15, wherein the less than all of the plurality of sensing electrodes comprises:
    a first set of electrodes located at the location of the touch;
    a second set of electrodes located immediately adjacent to the first set of electrodes; and
    a third set of electrodes located immediately adjacent to the second set of electrodes.

20. The system of claim 15, wherein the plurality of sensing electrodes are arranged in a two-dimensional array along a first axis and a second axis, wherein the less than all of the plurality of sensing electrodes comprises electrodes arranged along the first axis.

* * * * *